(12) United States Patent
Johnson et al.

(10) Patent No.: US 6,373,188 B1
(45) Date of Patent: Apr. 16, 2002

(54) EFFICIENT SOLID-STATE LIGHT EMITTING DEVICE WITH EXCITED PHOSPHORS FOR PRODUCING A VISIBLE LIGHT OUTPUT

(75) Inventors: Burgess R. Johnson, Bloomington; Wei Yang, Minnetonka, both of MN (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 09/218,816

(22) Filed: Dec. 22, 1998

(51) Int. Cl.$^7$ .......................... H05B 33/12; H01L 33/00
(52) U.S. Cl. .................. 313/506; 313/502; 313/500; 257/94
(58) Field of Search ................. 313/498–512, 313/112, 113; 257/94, 98, 99, 96, 97, 81, 91, 680

(56) References Cited

U.S. PATENT DOCUMENTS

| | | | |
|---|---|---|---|
| 3,864,592 A | 2/1975 | Pankove ...................... 313/503 |
| 4,081,764 A | 3/1978 | Christmann et al. ... 331/94.5 H |
| 4,668,049 A | 5/1987 | Canter et al. ................ 350/345 |
| 4,822,144 A | * 4/1989 | Vriens ........................ 350/339 |
| 4,882,617 A | * 11/1989 | Vriens ........................ 358/60 |
| 4,894,116 A | 1/1990 | Barrow et al. ............... 156/643 |
| 5,015,999 A | 5/1991 | Imai et al. ................... 340/702 |
| 5,126,214 A | 6/1992 | Tokailin et al. ............. 428/690 |
| 5,267,062 A | 11/1993 | Bottorf ........................ 359/40 |
| 5,396,406 A | 3/1995 | Ketchpel ..................... 362/27 |
| 5,422,902 A | * 6/1995 | Mensz ......................... 372/43 |
| 5,442,204 A | * 8/1995 | Mensz ........................ 257/103 |
| 5,557,115 A | * 9/1996 | Shakuda ...................... 257/81 |
| 5,578,839 A | 11/1996 | Nakamura et al. ............ 257/96 |
| 5,581,150 A | 12/1996 | Rack et al. .................. 313/509 |
| 5,625,202 A | * 4/1997 | Chai ............................ 257/94 |
| 5,650,692 A | 7/1997 | Vetanen et al. ............. 313/506 |
| 5,700,591 A | 12/1997 | Okajima et al. ............. 428/690 |
| 5,734,182 A | 3/1998 | Nakamura et al. ............ 257/96 |
| 5,747,832 A | 5/1998 | Nakamura et al. .......... 257/103 |
| 5,813,752 A | * 9/1998 | Singer et al. ................ 362/293 |
| 5,813,753 A | * 9/1998 | Vriens et al. ................ 362/293 |
| 5,821,685 A | 10/1998 | Peterson ..................... 313/467 |
| 5,834,331 A | * 11/1998 | Razeghi ....................... 438/40 |

FOREIGN PATENT DOCUMENTS

| | | |
|---|---|---|
| FR | 2083868 A | 12/1971 |
| GB | 1328303 A | 8/1973 |
| WO | 9748138 A | 12/1997 |
| WO | WO 97/48138 A2 | 12/1997 |

OTHER PUBLICATIONS

Patent Abstracts of Japan, vol. 1998, No. 11, Sep. 30, 1998 & JP 10 163526 A (Matsushita Electron Corp), Jun. 19, 1998 abstract.

* cited by examiner

Primary Examiner—Nimeshkumar D. Patel
Assistant Examiner—Karrabi Guharay
(74) Attorney, Agent, or Firm—John G. Shudy, Jr.

(57) ABSTRACT

A more efficient solid-state light emitting device in which phosphors excited by radiation produce visible light. The efficiency is increased by, for example, providing a reflector adjacent to the phosphor layer for reflecting at least some of the radiation that passes through the phosphor, back into the phosphor. The reflector may also reflect at least some of the visible light that is emitted by the phosphor toward a designated light output. Alternatively, or in addition to, the lateral edges of the active region of the radiation source can be at least partially surrounded by a visible light emitting phosphor and a reflector. This allows more of the radiation to interact, and thus excite, the phosphor material, making the device more efficient. The reflector also may reduce optical and radiation cross talk between adjacent light emitting devices.

32 Claims, 5 Drawing Sheets

EFFICIENT SOLID-STATE LIGHT EMITTING DEVICE WITH EXCITED PHOSPHORS FOR PRODUCING A VISIBLE LIGHT OUTPUT

BACKGROUND OF THE INVENTION

This invention relates to light emitting devices, and more particularly, to light emitting devices for use in displays or the like that excite one or more phosphors to produce a light output.

Currently there are many types of light emitting devices that are on the market. One of the original light emitting devices is a cathode ray tube. Cathode ray tubes have been used for many years in television and computer monitor applications.

Another type of light emitting device is a liquid crystal display (LCD). Due in part to its lower energy consumption and the lack of the need for an ultra-high vacuum environment, the LCD is widely used in portable computers and other special purpose applications, such as watches, calculators, and instrument panels. A limitation of an LCD is that back or external lighting is typically required. Further, some display characteristics such as color, brightness, and contrast can be viewing angle dependent.

Another type of light emitting device is a plasma display (PD). A conventional PD device includes a gaseous plasma UV source and a phosphor screen. The gaseous plasma UV source is used to excite the phosphors in the phosphor screen, which then produce the visible light output. A limitation of a PD device is that typical gaseous plasma UV sources require a vacuum environment and high voltages.

Another type of light emitting device is a field emitter display (FED) device. Like a PD device, a FED device excites phosphors to produce a visible light output. However, unlike a PD device, the FED device uses a field induced electron emission. Field induced electron emission can typically only be accomplished in a vacuum environment. Thus, like a PD device, the FED device requires a vacuum environment.

Another type of light emitting device is an electroluminescence (EL) device. Like the PD and FED devices, an EL device excites phosphors to produce a visible light output. Unlike the PD and FED devices, however, the EL device excites the phosphor using direct injection of current. Direct injection of current does not require a vacuum environment. However, EL devices typically have a limited color emission spectrum.

An improved light emitting device is disclosed in WO 97/48138 to Mensz et al. Mensz et al. discloses a solid-state GaN-based UV Light Emitting Diode (LED) that provides a UV radiation to a phosphor layer. The UV LED excites the phosphor layer to produce a visible light output. Mensz et al. has a number of advantages over the LED, PD, FED and EL type devices. First, Mensz et al. do not require back or external lighting, as required by LCD type devices. Further, Mensz et al. does not require a vacuum and/or high voltage power source, as required by PD and FED type devices. Finally, the solid-state GaN-based UV LED with excited phosphors of Mensz et al. may provide a wider range of colors than an EL type device.

A limitation of Mensz et al. is that a significant amount of UV radiation may not be converted to visible light. In some embodiments, a substantial amount of UV radiation is not directed at the phosphor layer. This may reduce the efficiency of the device. Also, some of the UV radiation that actually enters the phosphor passes through the phosphor and out of the other side, without exciting the phosphor. This pass-through UV radiation also reduces the efficiency of the device. Further, in an array of devices, the UV radiation escaping from one device can impinge on the phosphors of neighboring devices, causing unwanted emission of visible light from the neighboring devices. This optical cross talk is undesirable in many display applications.

SUMMARY OF THE INVENTION

The present invention overcomes many of the disadvantages of the prior art by providing a more efficient solid-state light emitting device that excites phosphors to produce a visible light output. To accomplish this, the present invention contemplates providing a reflector adjacent to the phosphor layer for reflecting at least some of the UV radiation that passes through the phosphor, back into the phosphor. The reflector may also reflect at least some of the visible light that is emitted by the phosphor toward a designated light output. In another embodiment, the radiation source is at least partially surrounded by the visible light emitting phosphor. This configuration may cause more of the radiation that is emitted from the active region to reach and interact with the phosphor material.

In one illustrative embodiment of the present invention, a visible light-emitting phosphor layer is positioned between a radiation source and a reflector. The radiation source is preferably a UV light emitting diode (LED), which is formed on a transparent substrate. The reflector is positioned above the phosphor layer, and reflects at least some of the radiation that passes through the phosphor, back into the phosphor. The reflector may also reflect at least some of the visible light that is emitted from the phosphor toward the transparent substrate for viewing. In some embodiments, the reflector may also be conductive and serve as both a reflector and an interconnect layer to the radiation source.

In a second illustrative embodiment of the present invention, the radiation source has an active region that is at least partially surrounded by a visible light emitting phosphor. When properly biased, the active region provides an excitation radiation to the visible light emitting phosphor. Because the active region is at least partially surrounded by the visible light emitting phosphor, more of the radiation that is emitted by the active region is allowed to interact with, and thus excite, the phosphor material. This helps increase the overall efficiency of the light emitting device.

To surround the active region with a visible light emitting phosphor, the radiation source may have a column-shaped portion with a top surface and one or more side walls. The active region is located somewhere in the column-shaped portion. The phosphor layer is then provided around the one or more side walls of the column-shaped portion, thereby surrounding at least part of the circumference of the active region. A reflector may be provided over and around the phosphor layer to help improve the efficiency of the device.

It is contemplated that the above visible light emitting devices may be provided in an array configuration to form a display. In such a display, an array of phosphor segments, each including one or more excitable, visible light-emitting phosphors, may be positioned adjacent to a corresponding array of radiation sources. The radiation sources preferably can be individually addressed via a number of row and column contact layers. Accordingly, the radiation sources can be controlled to provide radiation to only selected phosphor segments. The row or column contact layer may also serve as a reflector adjacent to each of the phosphor segments. In the embodiment where the radiation source has a column-shaped portion with a top surface and one or more side walls, it is contemplated that the reflector may extend over and around the phosphor layer. This may reduce the UV radiation produced in one pixel from impinging on the phosphors of a neighboring pixel, which translates into reduced optical cross talk between pixels.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein.

DETAILED DESCRIPTION OF THE PREFERRED EMBODIMENTS

Figure 1:
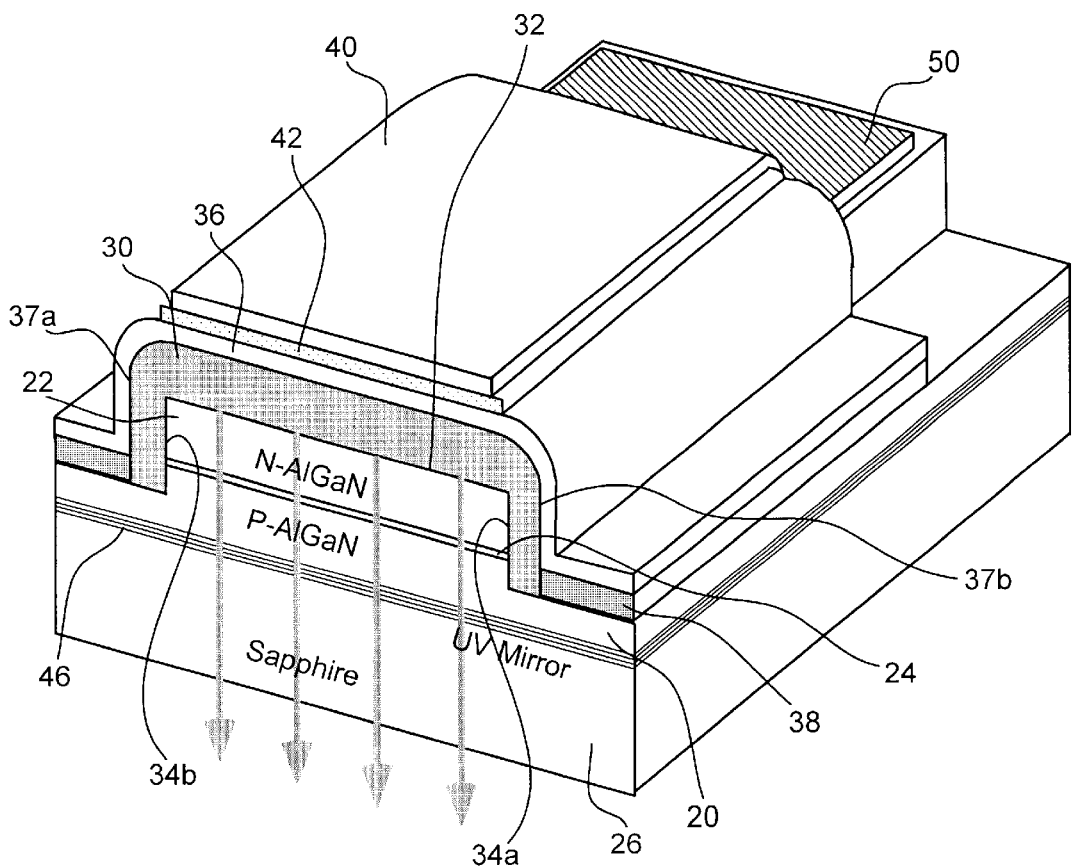
FIG. 1 is a partial cut-away perspective view of an illustrative solid-state UV light emitting device with one or more excitable, visible light-emitting phosphors in accordance with the present invention.

FIG. 1 is a partial cut-away perspective view of an illustrative solid-state UV light emitting diode (LED) with one or more excitable, visible light-emitting phosphors. The UV LED is constructed from a P-AlGaN layer 20, an N-AlGaN layer 22, and an active region 24 situated therebetween. The active region 24 may include a GaN/AlGaN double hetero-structure or multiple quantum wells, as more fully described below. The UV LED is preferably grown on a transparent substrate 26 made from sapphire or the like. In a preferred embodiment, the N-AlGaN layer 22, the active region 24, and part of the P-AlGaN layer 20 are etched away to provide side walls 34A and 34B.

A phosphor coating 30 is provided on the top surface 32 of the UV LED, and may cover the side walls 34A and 34B as well. When excited by UV radiation, the phosphor coating preferably produces a visible light emission having a red, green, or blue color. A metal reflector 36 is then provided on top of the phosphor coating 30, as shown, and preferably down the sides of the phosphor coating 30. The side portions 37A and 37B of the reflector provide optical isolation between adjacent pixels in an array.

The reflector 36 reflects at least some of the UV radiation that is passed through the phosphor coating 30, back into the phosphor coating 30. The reflector 36 also reflects at least some of the visible light that is emitted by the phosphor coating 30 toward the transparent substrate 26 for viewing. Accordingly, the reflector 36 increases the efficiency of the device.

The enhanced phosphor efficiency provided by the reflector may allow thinner phosphor layers to be used, thus reducing the fabrication costs by simplifying the processes of deposition and patterning subsequent layers over the topography of the patterned phosphors. The increased efficiency provided by the reflector may also allow less efficient phosphors to be used. Less efficient phosphors may have reduced costs or improved spectral characteristics. The improved efficiency made possible by the reflector may also allow alternative UV emitting materials to be used. While these alternative UV emitting materials may have less UV emission intensity or lower energy UV photons, they may be less expensive to fabricate. Finally, it is contemplated that the reflector may be used to hermetically seal the phosphors, allowing the use of phosphors that are sensitive to atmospheric degradation.

It is contemplated that a UV mirror 46 may be provided below the active region 24. The UV mirror 46 may be tuned to allow the visible light to pass therethrough to the transparent substrate 26, but to reflect the UV radiation emitted by the active region 24. Accordingly, the UV radiation is effectively trapped between the UV mirror 46 and the reflector 36. As a result, more of the UV radiation will eventually interact with the phosphor coating to produce visible light. It is contemplated that the UV mirror may be a Distributed Bragg Reflector (DBR) formed from a number of GaN/AlGaN quarter wave stacks, grown prior to the formation of the P-N junction, as more fully described with reference to FIG. 6.

To reduce the overall size of the device, the reflector 36 may be conductive and may provide an electrical connection to at least one terminal of the UV LED. It is contemplated that the reflector 36 may be made from aluminum, which reflects most of the UV and the visible light, and is also conductive. In the embodiment shown, the reflector 36 serves to provide an electrical connection to the P-AlGaN layer (first contact region) via a P-ohmic contact 38. Thus, the reflector 36 serves as a bus line in one direction (column). The bus line in the other direction (row) may be provided by a metal stripe 40, which is shown overlapping the reflector 36 above the UV LED. An N-ohmic contact 50 is provided on the top surface of the N-AlGaN layer 22 in an open region that does not include the phosphor layer 30 and the reflector 36. The metal strip 40 serves to provide an interconnection to the N-AlGaN layer (second contact region) via the N-ohmic contact 50. The first and second metal layers 36 and 40 are separated by an insulating layer 42 (e.g. $SiO_2$).

Figure 2:
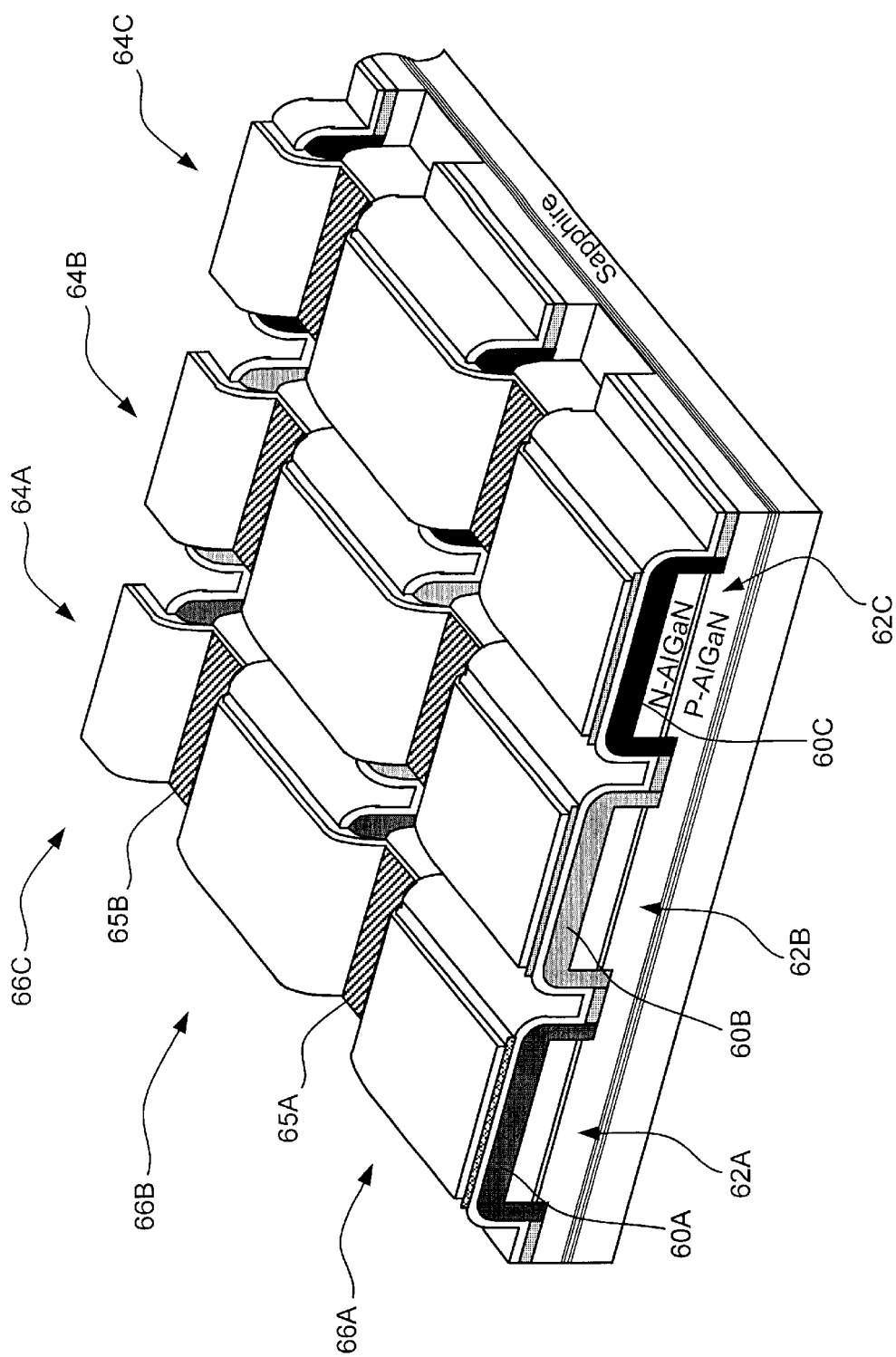
FIG. 2 is a partial cut-away perspective view of an array of solid-state UV light emitting devices of FIG. 1.

FIG. 2 shows an interconnected pixel array of the UV LED devices of FIG. 1. The array includes an array of phosphor segments 60A, 60B, and 60C, each including one or more excitable, visible light-emitting phosphors. The array of phosphor segments 60A, 60B, and 60C is positioned adjacent to a corresponding array of UV LED radiation sources 62A, 62B, and 62C. The radiation sources 62A, 62B, and 62C selectively provide radiation to the corresponding phosphor segments 60A, 60B, and 60C to selectively excite visible light emissions therefrom.

Each of the radiation sources 62A, 62B, and 62C has a first contact region and a second contact region. A number of row contact layers 64A, 64B, and 64C are provided, wherein each row contact layer electrically connects the first contact regions 65A and 65B of the radiation sources that are associated with a corresponding row in the array. Likewise, a number of column contact layers 66A, 66B, and 66C are provided, wherein each column contact layer 66A, 66B, and 66C is provided over at least part of the phosphor segments 60A, 60B, and 60C of the radiation sources that are associated with a corresponding column. The column contact layers 66A, 66B, and 66C also electrically connect the first contact regions 62A and 62B of each radiation source that is associated with a corresponding column. As indicated above, it is contemplated that the column contact layers 66A, 66B, and 66C are reflective to reflect at least some of the UV radiation and/or visible light rays that exit from the corresponding phosphor segments 60A, 60B, and 60C, back into the phosphor segments 60A, 60B, and 60C.

In view of the foregoing, the phosphor layers 60A, 60B, and 60C may be elongate phosphor strips having a length and a width, wherein the length is aligned with the radiation devices that are associated with a common column in the array. Alternatively, the phosphor strips may be individual phosphor segments, as shown in FIGS. 1–2.

Likewise, the column contact layers 66A, 66B, and 66C, may be elongate strips having a length and a width, wherein the length is aligned with the radiation devices that are associated with a common column in the array. Alternatively, it is contemplated that the column contact layers 66A, 66B, and 66C, may include a number of individual contact segments. Finally, the row contact layers 64A, 64B, and 64C, may be elongate strips having a length and a width, wherein the length is aligned with the radiation devices that are associated with a common row in the array. Alternatively, it is contemplated that the row contact layers 64A, 64B, and 64C, may include a number of individual contact segments.

To form a display, each row 64A, 64B, and 64C, may include a phosphor that produces a different color of visible light. That is, the phosphor layer 60A for a first row 64A of UV LEDs may emit a red visible light. The phosphor layer 60B for a second row 64B of UV LEDs may emit a green visible light. Finally, the phosphor layer 60C for a third row 64C of UV LEDs may emit a blue visible light. Accordingly, the color of the resulting display can be controlled by selectively turning on the appropriate UV LEDs in the array.

Figure 3:
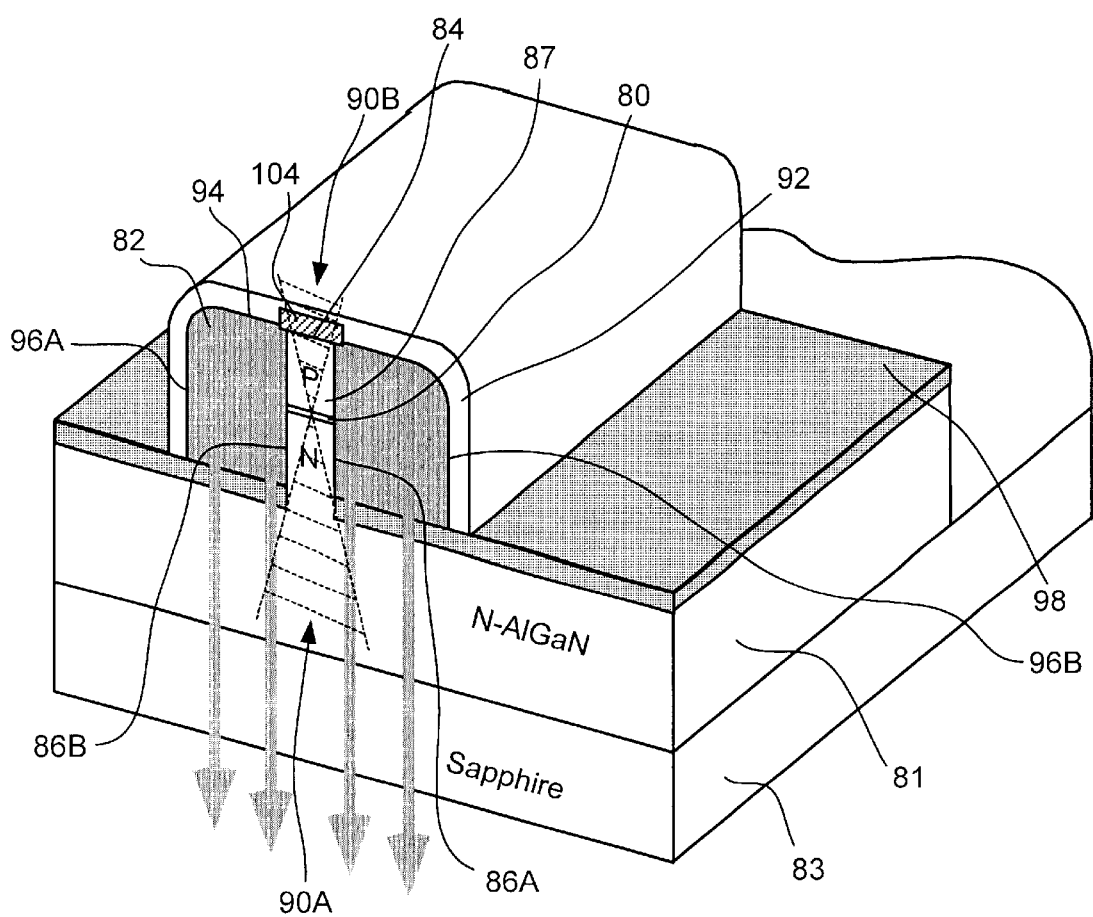
FIG. 3 is a partial cut-away perspective view of another illustrative solid-state UV light emitting device, with the active region of the UV LED laterally surrounded by one or more excitable, visible light-emitting phosphors for increased efficiency.

FIG. 3 is a partial cut-away perspective view of another illustrative solid-state UV light emitting device, with the active region of the UV LED laterally surrounded by one or more excitable, visible light-emitting phosphors for increased efficiency. In this embodiment, the radiation source has an active region 80 that is surrounded by a visible light emitting phosphor 82. When properly biased, the active region 80 provides the excitation radiation to the visible light emitting phosphor 82. Because the active region 80 is substantially surrounded by the visible light emitting phosphor 82, more of the radiation is allowed to interact with, and thus excite, the phosphor material 82. This helps make the device more efficient.

The radiation source preferably has a column-shaped portion with a top surface 84 and one or more side walls 86A and 86B. The active region 80 is preferably located in the column-shaped portion, as shown. An N-AlGaN layer 81 has a top portion extending into the column-shaped portion, and a bottom portion that extends laterally outward from the one or more side walls 86A and 86B. Above the active region 80 is a P-AlGaN layer 87 and a P-ohmic contact region 104.

In the illustrative embodiment, the phosphor layer 82 is provided around the one or more side walls 86A and 86B of the column-shaped portion of the radiation source, thereby substantially surrounding at least the circumference of the active region 80. In this configuration, only a small fraction of the UV radiation that is emitted by the active region 80 is not directed at the phosphor layer 82. These wasted rays are indicated by light cones 90A and 90B. Because the light cones 90A and 90B are relatively narrow, the efficiency of the light emitting device is increased.

It is also contemplated that a reflector 92 may be provided over the phosphor layer 82 to further increase the efficiency of the light emitting device. The reflector 92 preferably extends over the top surface 94, and at least over a portion of the side walls 96A and 96B of the phosphor layer 82. The reflector 92 may be conductive, and may provide an electrical connection to the P-AlGaN layer 87 via a P-GaN ohmic contact 104. An insulating layer 98 electrically insulates the reflector 92 from the lower N-AlGaN layer 81.

The embodiment shown in FIG. 3 may be particularly suitable for very small pixel dimensions applications. That is, because the UV LED is in the form of a narrow column, the lateral dimension of each pixel may be reduced. The UV LED is still able to pump the phosphor efficiently, however, because the p-n junction is almost completely surrounded by the phosphor. The efficiency is further enhanced by the metal reflector, which may also serve as the column bus line as described above. To even further reduce the size of each pixel, the lower layer 81 of N-AlGaN or N-GaN can be highly doped, and may become sufficiently conductive to be used as a bus line in the other direction (e.g. row direction).

Figure 4:
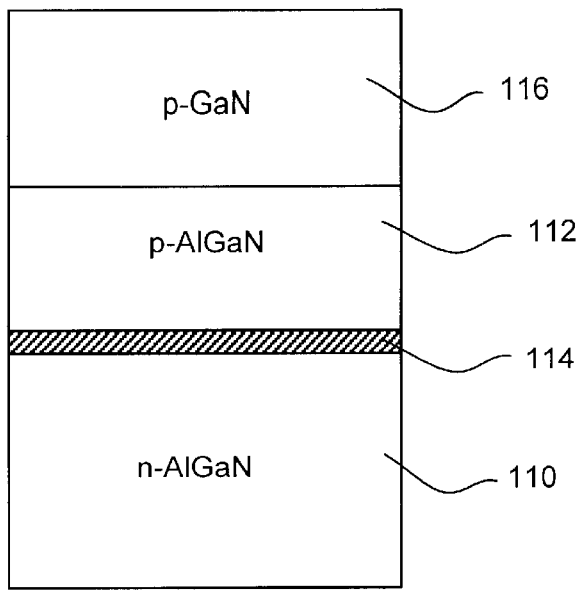
FIG. 4 is a schematic diagram showing an illustrative UV LED device having a single quantum well.
Figure 5:
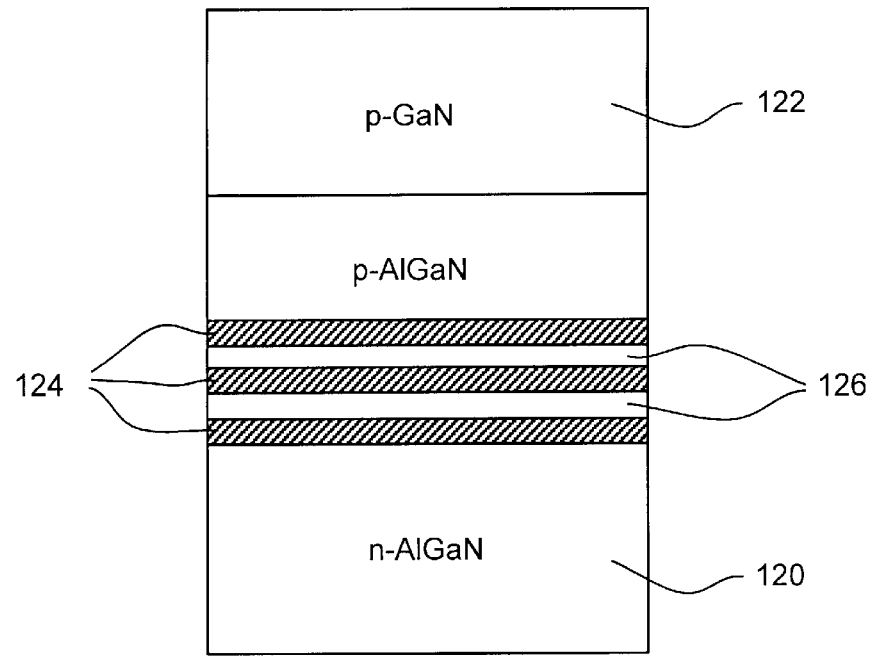
FIG. 5 is a schematic diagram showing another illustrative UV LED device having multiple quantum wells.

FIGS. 4–5 show an illustrative solid-state UV LED device that can be used in conjunction with the embodiments shown in FIGS. 1–3. FIG. 4 is a schematic diagram showing an illustrative UV LED device that has a single quantum well. The illustrative UV LED device includes a lower N-AlGaN layer 110, an upper P-AlGaN layer 112, and a single GaN quantum well layer 114 therebetween. The lower N-AlGaN layer 110 preferably has an Al mole fraction larger than 0% but less than 50%. The upper P-AlGaN layer 112 preferably has an Al mole fraction larger than 0% but less than 20%. The single quantum well is preferably a GaN quantum well, with a thickness between 20 Å and 200 Å. Depending on the desired wavelength, it may be beneficial to replace the GaN quantum well material with InGaN. The single InGaN quantum well may also have a thickness of between 20 Å and 200 Å.

Finally, a P-GaN ohmic contact layer 116 may be provided to provide a low resistance contact to the P-AlGaN layer 112. Likewise, an N-GAN ohmic contact layer may be provided (not shown) to provide a low resistance contact to the N-AlGaN layer 110.

FIG. 5 is a schematic diagram showing another illustrative UV LED device that has multiple quantum wells. In this embodiment, the lower N-AlGaN layer 120 may have an Al mole fraction larger than 0% but less than 50%. The upper P-AlGaN layer 122 may have an Al mole fraction larger than 0% but less than 20%. The multiple GaN quantum wells 124 may each have a thickness between 20 Å and 200 Å, and may be separated by AlGaN barrier layer(s) 126 having an Al mole fraction larger than 0% but less 50%. Depending on the desired wavelength, it may be beneficial to replace the GaN quantum well material and the AlGaN barrier layer material with InGaN and InAlGaN, respectively. The InGaN quantum wells may each have an Al mole fraction larger than 0% but less than 10%, and a thickness between 20 Å and 200 Å. The InGaN barrier layer(s) may have an In mole fraction larger than or equal to 0% but less than that in the InGaN quantum wells.

Figure 6:
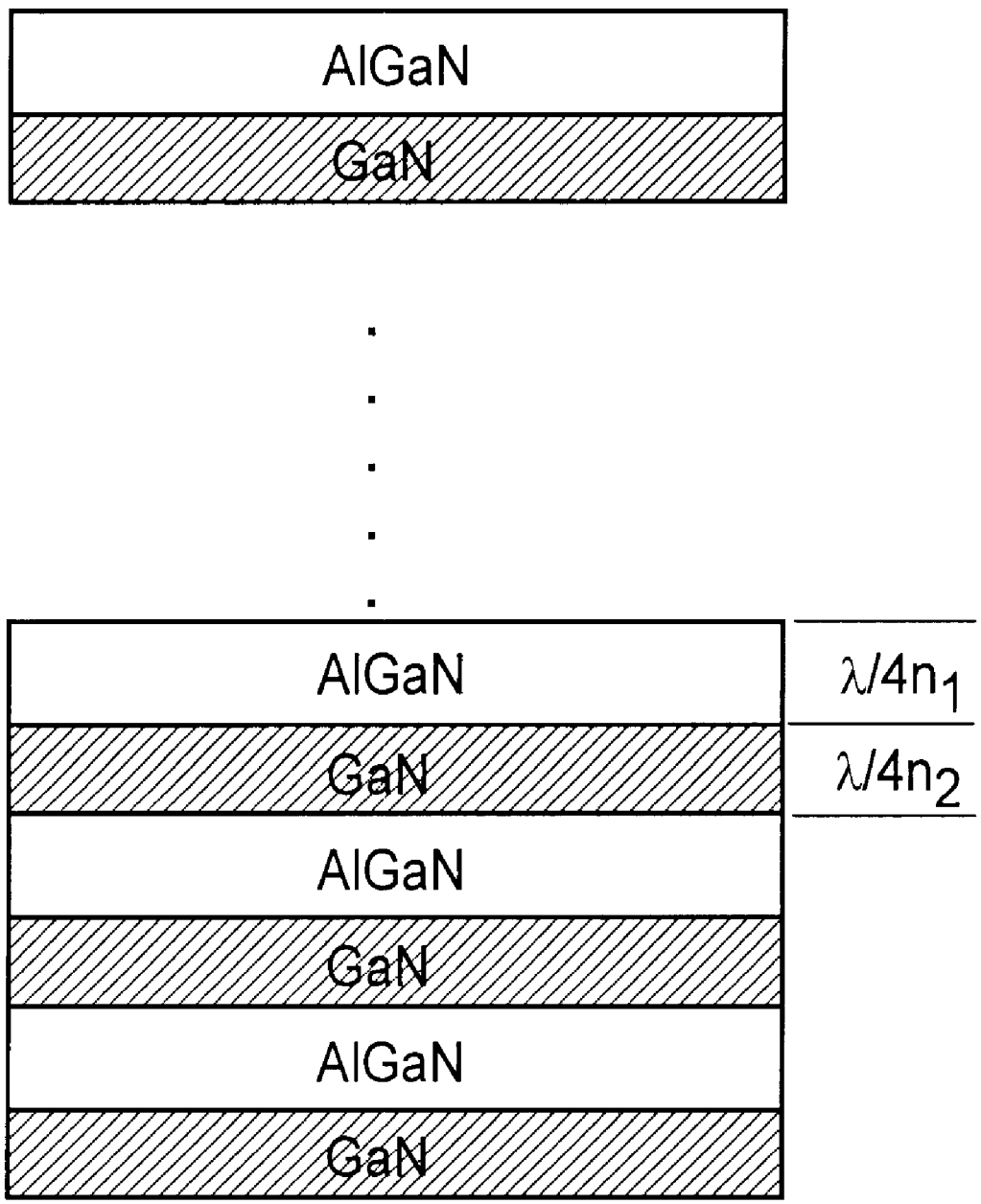
FIG. 6 is a schematic diagram showing an illustrative UV mirror.

FIG. 6 is a schematic diagram showing an illustrative UV mirror. The illustrative UV mirror may be used in conjunction with any of the embodiments shown and described with reference to FIGS. 1–3. The UV mirror preferably includes a stack of alternating GaN and AlGaN layers, each having an optical length of one-fourth of the peak wavelength of the UV LED emission. This makes the UV mirror reflective for UV radiation, but relatively transmissive for the visible light emitted by the phosphor. In the illustrated embodiment, $\lambda$ is the UV LED peak wavelength, $n_1$ is the index of refraction of AlGaN, and $n_2$ is the index of refraction of GaN at wavelength $\lambda$.

Having thus described the preferred embodiments of the present invention, those of skill in the art will readily appreciate that the teachings found herein may be applied to yet other embodiments within the scope of the claims hereto attached.

What is claimed is:

1. A light emitting device comprising:
    a phosphor layer having two opposing sides including one or more excitable, light-emitting phosphors;
    a radiation source positioned adjacent a first one of the two opposing sides of the phosphor layer for providing a radiation to excite a light emission from the phosphor layer, the radiation source having a first contact region and a second contact region;
    reflector means provided adjacent a second one of the two opposing sides of the phosphor layer for reflecting at least some of the radiation and light emission that exits from the phosphor layer back into the phosphor layer; and
    wherein said reflector means comprises a first contact layer positioned over at least part of the phosphor layer, the first contact layer being at least partially reflective and at least partially electrically conductive, said first contact layer being electrically connected to the first contact region.

2. A light emitting device according to claim 1, further comprising a second contact layer that is electrically connected to the second contact region.

3. A visible light emitting device comprising:
    a transparent substrate;
    a phosphor layer including one or more excitable, visible light-emitting phosphors;
    a radiation source positioned between the transparent substrate and the phosphor layer for providing a radiation to excite visible light emission from the phosphor layer, the radiation source having a first contact region and a second contact region;
    a first contact layer provided over at least part of the phosphor layer and reflecting at least some of the radiation that travels through the phosphor layer back into the phosphor layer, the first contact layer being electrically connected to the first contact region; and
    a second contact layer being electrically connected to the second contact region.

4. A visible light emitting device according to claim 3, wherein said phosphor layer includes one or more UV-excitable, visible light-emitting phosphors, and said radiation source is a UV radiation source emitting ultraviolet radiation.

5. A visible light emitting device according to claim 4, further including a UV mirror for reflecting UV radiation, the UV mirror being positioned between the UV radiation source and the transparent substrate and being at least partially transparent to visible light.

6. A visible light emitting device according to claim 3, wherein the radiation source has a top surface, one or more side walls, and a lower portion that extends laterally outward from the one or more side walls, said phosphor layer being positioned between at least part of the top surface of the radiation source and the first contact layer.

7. A visible light emitting device according to claim 6, wherein the first contact layer extends over at least part of the top surface and down at least part of selected side walls of the radiation source.

8. A visible light emitting device according to claim 7, wherein the radiation source includes a first portion that is of a first conductivity type and a second portion that is of a second conductivity type, with an active region therebetween.

9. A visible light emitting device according to claim 8, wherein the first portion of the radiation source is at least partially in the region defined by the top surface and the one or more side walls of the radiation source, and the second portion is at least partially in the lower portion of the radiation source that extends laterally outward from the one or more side walls.

10. A visible light emitting device according to claim 9, wherein the second portion of the radiation source forms at least part of the second contact region.

11. A visible light emitting device according to claim 10, wherein the phosphor layer and the first contact layer do not overlap the second portion of the radiation source in an open region sad second contact layer making an electrical connection to the second portion of the radiation source in the open region.

12. A visible light emitting device according to claim 11, wherein the phosphor layer is an elongate phosphor strip having a length and a width, the length of the phosphor layer aligned with the radiation device in a first direction.

13. A visible light emitting device according to claim 12, wherein the first contact layer is an elongate strip having a length and a width, the length of the first contact layer aligned with the elongate phosphor strip.

14. A visible light emitting device according to claim 13, wherein the second contact layer is an elongate strip having a length and a width, the length of the second contact layer aligned with the radiation device in a second direction, wherein the second direction is perpendicular to the first direction.

15. A visible light emitting device according to claim 14, wherein the second contact layer is positioned above the first contact layer and separated therefrom by an insulating layer.

16. A visible light emitting device according to claim 3, wherein the first contact layer is formed from, at least in part, aluminum.

17. A visible light emitting device according to claim 3, wherein the radiation source is a GaN-based light emitting diode.

18. A visible light emitting device according to claim 17, wherein the transparent substrate is formed from, at least in part, sapphire.

19. A visible light emitting device according to claim 17, wherein one or more excitable, visible light-emitting phosphors, produces a visible light emission having a color that is selected from the group consisting of red, green, and blue.

20. A visible light emitting device comprising:
    a transparent substrate;
    a phosphor layer including one or more excitable, visible light-emitting phosphors;
    a radiation source positioned between the transparent substrate and the phosphor layer for providing a radiation to excite visible light emission from the phosphor layer, the radiation source having a first contact region and a second contact region;
    a first contact layer provided over at least part of the phosphor layer and reflecting at least some of the visible light emission from the phosphor layer back toward the transparent substrate, the first contact layer being electrically connected to the first contact region; and a second contact layer being electrically connected to the second contact region.

21. A visible light emitting device according to claim 20, wherein said phosphor layer includes one or more UV-excitable, visible light-emitting phosphors, and said radiation source is a UV radiation source.

22. A light emitting device comprising:

a radiation source having a first contact region and a second contact region for providing radiation, said radiation source having a top surface and one or more side walls;

a phosphor layer provided adjacent to at least a portion of the one or more side walls of the radiation source, the phosphor layer including one or more excitable, light-emitting phosphors that produce a light emission when excited by the radiation, the phosphor layer extending laterally away from the side walls of the radiation source a selected distance, at least in one direction, to define a top wall and one or more side walls;

a first contact layer, the first contact layer being provided over at least part of the top wall of the phosphor layer.

23. A light emitting device according to claim 22, wherein the first contact layer is provided over at least part of the one or more side walls of the phosphor layer.

24. A light emitting device according to claim 23, wherein the first contact layer is electrically connected to the bottom portion of the radiation source.

25. A light emitting device according to claim 22, wherein the first contact layer is formed from, at least in part, aluminum.

26. A light emitting device according to claim 22, further comprising a second contact layer, the second contact layer electrically connected to the top portion of the radiation source.

27. A light emitting device comprising:

a radiation source having a first contact region and a second contact region for providing radiation, said radiation source having a top surface and one or more side walls;

a phosphor layer provided adjacent to at least a portion of the one or more side walls of the radiation source, the phosphor layer including one or more excitable, light-emitting phosphors that produce a light emission when excited by the radiation;

a first contact layer for providing an electrical connection to the first contact region of the radiation source; and wherein the first contact layer reflects UV radiation.

28. A light emitting device, comprising:

a radiation source having a first contact region and a second contact region for providing radiation, said radiation source having a top surface and one or more side walls;

a phosphor layer provided adjacent to at least a portion of the one or more side walls of the radiation source, the phosphor layer including one or more excitable, light-emitting phosphors that produce a light emission when excited by the radiation;

a first contact layer for providing an electrical connection to the first contact region of the radiation source; and wherein the first contact layer reflects visible light.

29. An array of visible light emitting devices, comprising:

a transparent substrate;

an array of phosphor segments, each including one or more excitable, visible light-emitting phosphors;

an array of radiation sources positioned between the transparent substrate and the array of phosphor segments for selectively providing radiation to excite visible light emission from corresponding phosphor segments, each of the radiation sources having a first contact region and a second contact region;

a number of column contact layers, each of the column contact layers being provided over at least part of the phosphor segments of the radiation sources that lie in a corresponding column of the array of radiation sources, the column contact layers reflecting at least some of the radiation that exits from the corresponding phosphor segments back into the phosphor segments, the column contact layers being electrically connected to the first contact regions of the radiation sources that lie in the corresponding column; and a number of row contact layers, each of the row contact layers being electrically connected to the first contact regions of the radiation sources that lie in a corresponding row of the array of radiation sources.

30. An array of visible light emitting devices according to claim 29, wherein the column contact layers also reflect at least some of the visible light emission from the corresponding phosphor segments.

31. An array of visible light emitting devices according to claim 30, wherein selected radiation sources of the array of radiation sources have side walls that face adjacent radiation sources, said column contact layers extending adjacent at least a portion of selected side walls to help reduce optical cross talk between the radiation sources.

32. An array of visible light emitting devices according to claim 31, wherein selected phosphor segments also extend along at least a portion of selected side walls of selected radiation sources, between the side walls and the corresponding column contact layers.

* * * * *

(12) EX PARTE REEXAMINATION CERTIFICATE (7976th)
United States Patent
Johnson et al.

(10) Number: US 6,373,188 C1
(45) Certificate Issued: Jan. 11, 2011

(54) EFFICIENT SOLID-STATE LIGHT EMITTING DEVICE WITH EXCITED PHOSPHORS FOR PRODUCING A VISIBLE LIGHT OUTPUT

(75) Inventors: Burgess R. Johnson, Bloomington, MN (US); Wei Yang, Minnetonka, MN (US)

(73) Assignee: Honeywell, Inc., Minneapolis, MN (US)

Reexamination Request:
No. 90/009,200, Jun. 24, 2008

Reexamination Certificate for:
Patent No.: 6,373,188
Issued: Apr. 16, 2002
Appl. No.: 09/218,816
Filed: Dec. 22, 1998

(51) Int. Cl.
*H05B 33/12* (2006.01)
*H01L 33/00* (2006.01)

(52) U.S. Cl. .................. 313/506; 313/502; 313/500; 257/94

(58) Field of Classification Search .................. None
See application file for complete search history.

(56) References Cited

U.S. PATENT DOCUMENTS

| | | |
|---|---|---|
| 3,676,668 A | 7/1972 | Collins et al. |
| 3,774,086 A | 11/1973 | Vincent, Jr. |
| 3,875,456 A | 4/1975 | Kano et al. |
| 4,966,862 A | 10/1990 | Edmond |
| 5,416,342 A | 5/1995 | Edmond et al. |
| 5,537,433 A | 7/1996 | Watanabe |
| 5,793,062 A | 8/1998 | Kish, Jr. et al. |
| 5,813,752 A | 9/1998 | Singer et al. |
| 5,813,753 A | 9/1998 | Vriens et al. |
| 5,847,507 A | 12/1998 | Butterworth et al. |

FOREIGN PATENT DOCUMENTS

| | | |
|---|---|---|
| EP | 862794 A1 | 9/1998 |
| GB | 2326023 A | 9/1998 |
| JP | 02091980 | 3/1990 |
| JP | 5152609 | 6/1993 |
| JP | 07-099345 | 4/1995 |
| JP | 08102549 | 4/1996 |
| JP | 09153645 | 10/1997 |
| JP | 10-163526 | 6/1998 |

OTHER PUBLICATIONS

P.M. Mensz et al., "InxGa1–xN/AlyGa1–yN violet light emitting diodes with reflective p–contacts for high single sided light extraction," Electronic Letters, vol. 33, No. 24, Nov. 20, 1997, 2 pages.

Shuji Nakamura et al., "The Blue Laser Diode—GaN Based Light Emitters and Lasers," ISBN 3–540–61590–3 Springer–Verlag Berlin Heidelberg New York, pp. 201–221.

EP1145332—"Efficient Solid–State Light Emitting Device with Excited Phosphors for Producing a Visible Light Output," Prosecution History, 140 pages.

Ronda, C.R., et al., "Rare earth phosphors: fundamentals and applications," Journal of Alloys and Compounds, 1998, pp. 669–676.

Hill, P. "White–light diodes are set to tumble in price," OLE, Oct. 1997. pp. 17–20.

Steigerwald, D., "Reliability behavior of GaN–based light emitting diodes," Proceedings of the 2nd Int'l. Conf. on Nitride Semiconductors, Oct. 1997, pp. 514–515.

(Continued)

*Primary Examiner*—My-Trang Nu Ton

(57) ABSTRACT

A more efficient solid-state light emitting device in which phosphors excited by radiation produce visible light. The efficiency is increased by, for example, providing a reflector adjacent to the phosphor layer for reflecting at least some of the radiation that passes through the phosphor, back into the phosphor. The reflector may also reflect at least some of the visible light that is emitted by the phosphor toward a designated light output. Alternatively, or in addition to, the lateral edges of the active region of the radiation source can be at least partially surrounded by a visible light emitting phosphor and a reflector. This allows more of the radiation to interact, and thus excite, the phosphor material, making the device more efficient. The reflector also may reduce optical and radiation cross talk between adjacent light emitting devices.

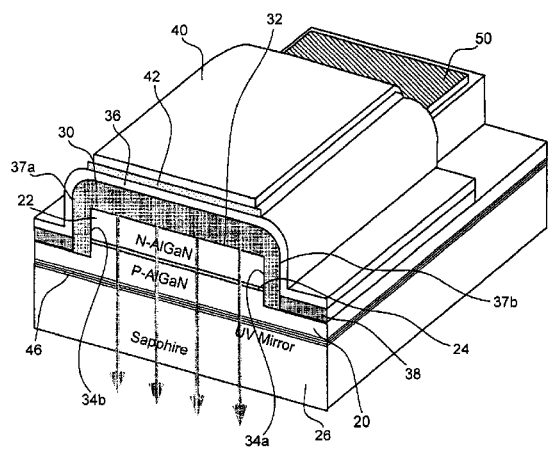

OTHER PUBLICATIONS

Mukai, T., et al., "High–power UV inGaN/AlGaN double heterostructure LED's," Dept. of Research & Dev., Nichia Chemical Indus., Ltd. Japan.

Steigerwald, D. et al., "III–V nitride semiconductors for high–performance blue and green light–emitting devices," Journal JOM, 1997, pp. 18–23, vol. 49, No. 9.

Bando, K., et al., "Development of high–bright and pure–white LED lamps," J. Light & Vis. Env., 1998, pp. 2–5, vol. 22, No. 1.

Foresi, J.S., et al., "Metal contacts to gallium nitride," Appl. Phys. Lett., American Institute of Physics, 1993, pp. 2859–2861, vol. 62, No., 22.

Vaudo, R.P., et al., "Characteristics of light–emitting diodes based on GaN p–n junctions grown by plasma–assisted molecular beam epitaxy," J. Appl. Phys. American Institute of Physics, 1995, pp. 2779–2783, vol. 79, No. 5.

Fan, Z., et al., "Very low reistance multilayer ohmiv contact to n–GaN," Appl. Phys. Lett. American Institute of Physics, 1996, pp. 1672–1674, vol. 68, No. 12.

Hewlitt Packard, "Reliability of precision optical performance allnGaP LED lamps in traffic signals and variable message signs." [Retrieved on Jul. 13, 2009]. Retrieved from Internet: <URL: http://chemlinks.beloit.edu/BlueLight/pages/hp/abi004.pdf>.

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 28 is determined to be patentable as amended.

New claims 33-51 are added and determined to be patentable.

Claims 1-27 and 29-32 were not reexamined.

28. A light emitting [device] *diode*, comprising:
a radiation source having a first contact region and a second contact region for providing radiation, said radiation source having a top surface, *a bottom surface*, and one or more side walls;
a phosphor layer provided adjacent to at least a portion of the one or more side walls of the radiation source, the phosphor layer including one or more excitable, light-emitting phosphors that produce a light emission when excited by the radiation;
a first contact layer for providing an electrical connection to the first contact region, *the first contact layer on the bottom surface* of the radiation source; and
wherein the first contact layer reflects visible light *toward the top surface of the radiation source and the first contact layer does not obstruct transmission of the visible light emitted from the top surface.*

33. *A light emitting device, comprising:*
*a light emitting diode including a radiation source and a first contact layer, the radiation source having a first contact region and a second contact region for providing radiation, said radiation source having a top surface and one or more side walls, and the first contact layer for providing an electrical connection to the first contact region of the radiation source; and*
*a phosphor layer provided adjacent to at least a portion of the one or more side walls of the radiation source, the phosphor layer including one or more excitable, light-emitting phosphors that produce a light emission when excited by the radiation,*
*wherein the first contact layer is disposed on a first side of the radiation source and reflects visible light from the phosphor layer from the first side of the radiation source toward a designated light output on a second side of the radiation source opposite the first side of the radiation source.*

34. *The light emitting device of claim 33, wherein the radiation source further includes an active region comprising a structure selected from the group consisting of multiple GaN/AlGaN quantum wells, a GaN/AlGaN double heterostructure, and a GaN quantum well layer.*

35. *The light emitting device of claim 33, wherein the first contact layer is configured to reflect visible light to increase efficiency of the light emitting device.*

36. *The light emitting device of claim 33, further comprising:*
*a first ohmic contact electrically connecting the first contact layer and the first contact region.*

37. *The light emitting device of claim 33, further comprising:*
*a second contact layer electrically connected to the second contact region.*

38. *The light emitting device of claim 33, wherein:*
*the radiation source further includes an active region; and*
*the light emitting device further comprises a mirror provided below the active region and configured to allow the visible light from the phosphor material to pass therethrough and to reflect the radiation emitted by the active region.*

39. *The light emitting device of claim 38, wherein the mirror comprises a Distributed Bragg Reflector formed from a stack of alternating GaN/AlGaN, each having an optical length of one-fourth of the peak wavelength of the UV LED emission, and having been grown prior to the formation of the active region.*

40. *The light emitting device of claim 33, further comprising a substrate on which the radiation source is grown.*

41. *The light emitting device of claim 40, wherein the substrate comprises sapphire.*

42. *A light emitting device, comprising:*
*a light emitting diode including a radiation source having a first contact region and a second contact region for providing radiation, said radiation source having a top surface and or more side walls, and further including a first ohmic contact layer for providing an electrical connection to the first contact region of tne radiation source;*
*a phosphor layer provided adjacent to at least a portion of the one or more side walls of the radiation source, the phosphor layer including one or more excitable, light-emitting phosphors that produce a light emission when excited by the radiation; and*
*wherein the first ohmic contact layer is disposed on a first side of the radiation source and reflects visible light from the first side of the radiation source through the radiation source towards a designated light output on a second side of the radiation source.*

43. *The light emitting device of claim 42, wherein the radiation source further includes an active region comprising a structure selected from the group consisting of multiple GaN/AlGaN quantum wells, a GaN/AlGaN double heterostructure, and a GaN quantum well layer.*

44. *The light emitting device of claim 42, wherein the first ohmic contact layer is configured to reflect visible light to increase efficiency of the light emitting device.*

45. *The light emitting device of claim 42, further comprising:*
*a first ohmic contact electrically connecting the first ohmic contact layer and the first contact region.*

46. *The light emitting device of claim 42, further comprising:*
*a second ohmic contact layer electrically connected to the second contact region.*

47. *The light emitting device of claim 42, wherein:*
*the radiation source further includes an active region; and*
*the light emitting device further comprises a mirror provided below the active region and configured to allow* the visible light from the phosphor layer to pass therethrough and to reflect the radiation emitted by the active region.

48. The light emitting device of claim 47, wherein the mirror comprises a Distributed Bragg Reflector formed from a stack of alternating GaN/AlGaN, each having an optical length of one-fourth of the peak wavelength of the UV LED emission, and having been grown prior to the formation of the active region.

49. The light emitting device of claim 42, further comprising a substate on which the radiation source is grown.

50. The light emitting device of claim 49, wherein the substrate comprises sapphire.

51. The light emitting device of claim 42, wherein the first ohmic contact layer does not obstruct light emitted from the designated light output.

\* \* \* \* \*